(12) United States Patent
Li et al.

(10) Patent No.: US 7,749,835 B2
(45) Date of Patent: Jul. 6, 2010

(54) TRENCH MEMORY WITH SELF-ALIGNED STRAP FORMED BY SELF-LIMITING PROCESS

(75) Inventors: Xi Li, Somers, NY (US); Kangguo Cheng, Guiderland, NY (US); Johnathan Faltermeier, Delanson, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 12/048,263

(22) Filed: Mar. 14, 2008

(65) Prior Publication Data

US 2009/0230471 A1  Sep. 17, 2009

(51) Int. Cl.
*H01L 21/84* (2006.01)
*H01L 21/8242* (2006.01)

(52) U.S. Cl. .................. 438/243; 438/386; 438/430; 438/739; 257/E21.561

(58) Field of Classification Search ........... 257/E21.561
See application file for complete search history.

(56) References Cited

U.S. PATENT DOCUMENTS

| | | | |
|---|---|---|---|
| 5,365,097 A | 11/1994 | Kenney | |
| 5,512,517 A | 4/1996 | Bryant | |
| 5,627,092 A | 5/1997 | Alsmeier et al. | |
| 5,641,694 A | 6/1997 | Kenney | |
| 5,793,082 A | 8/1998 | Bryant | |
| 6,121,651 A | 9/2000 | Furukawa et al. | |
| 6,323,082 B1 | 11/2001 | Furukawa et al. | |
| 6,426,252 B1 | 7/2002 | Radens et al. | |
| 6,465,370 B1 | 10/2002 | Schrems et al. | |
| 6,566,177 B1 | 5/2003 | Radens et al. | |
| 6,566,190 B2 | 5/2003 | Lee et al. | |
| 6,635,525 B1 | 10/2003 | Mandelman et al. | |
| 6,787,837 B2 * | 9/2004 | Matsubara | ............... 257/301 |
| 6,815,749 B1 | 11/2004 | Mandelman et al. | |
| 6,828,615 B2 | 12/2004 | Lee et al. | |
| 6,858,491 B1 * | 2/2005 | Kokubun | ............... 438/243 |
| 2003/0042524 A1 | 3/2003 | Lee et al. | |
| 2003/0098483 A1 | 5/2003 | Lee et al. | |

* cited by examiner

*Primary Examiner*—Stephen W Smoot
(74) *Attorney, Agent, or Firm*—Rosa S. Yaghmour; Joseph Petrokaitis

(57) ABSTRACT

A semiconductor structure is described. The structure includes a trench opening formed in a semiconductor substrate having a semiconductor-on-insulator (SOI) layer and a buried insulating (BOX) layer; and a filling material formed in the trench opening, the filling material forming a "V" shape within the trench memory cell, wherein the "V" shape includes a top portion substantially adjacent to a top surface of the BOX layer. A method of fabricating the semiconductor structure is also described. The method includes forming a trench opening in a semiconductor substrate having an SOI layer and a BOX layer; laterally etching the BOX layer such that a portion of the trench opening associated with the BOX layer is substantially greater than a portion of the trench opening associated with the SOI layer; filling the trench opening with a filling material; and recessing the filling material.

8 Claims, 4 Drawing Sheets

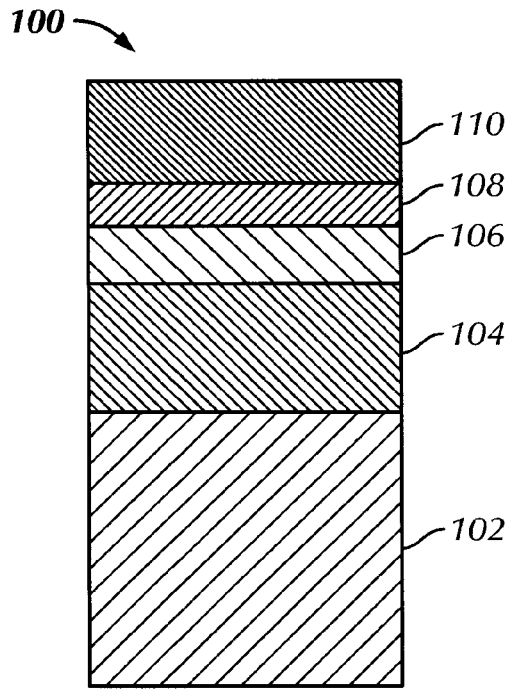
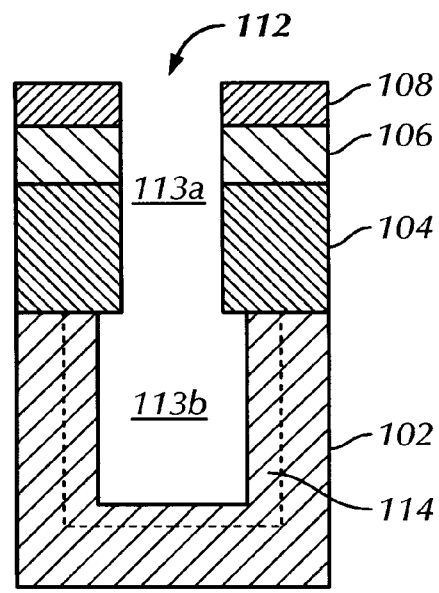
FIG. 1　　　　FIG. 2
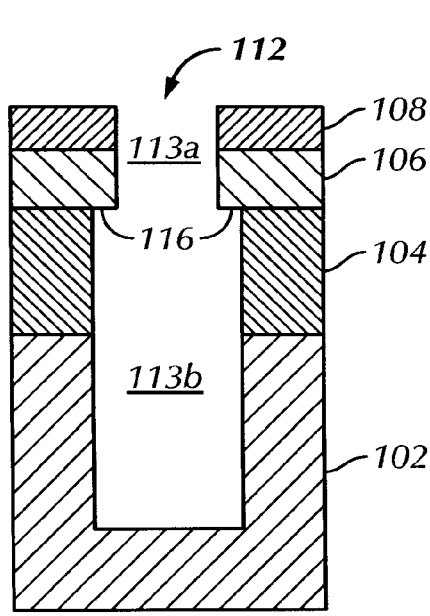
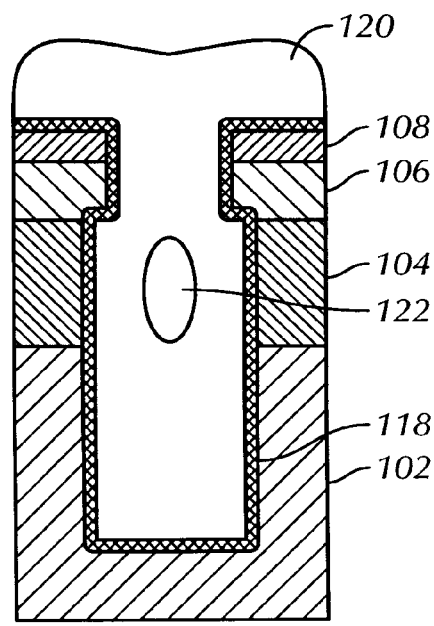
FIG. 3　　　　FIG. 4

Table 1: Exemplary Poly RIE Process

|  | Breakthrough | 1st Step RIE | 2nd Step RIE |
|---|---|---|---|
| TCP(W) | 680 | 200 | 450 |
| Bias(V) | 60 | 25 | 165 |
| Pressure(mT) | 7 | 50 | 35 |
| Time(s) | 6 | 30 | 40 |
| CF4(sccm) | 90 | | |
| SF6(sccm) | | 80 | |
| Cl2(sccm) | | 20 | |
| He(sccm) | | | 500 |
| O2(sccm) | | | 8 |
| Ar(sccm) | | | |
| HBr(sccm) | | | 500 |

TRENCH MEMORY WITH SELF-ALIGNED STRAP FORMED BY SELF-LIMITING PROCESS

BACKGROUND OF THE INVENTION

1. Technical Field

The present disclosure relates generally to microelectronic elements and their fabrication. In particular, the present disclosure relates to a trench memory having self-aligned strap formed by self-limiting recess.

2. Description of Related Art

Deep trench capacitors have extensively been used in various microelectronic elements such as dynamic random access memory (DRAM) or embedded DRAM (eDRAM). A DRAM includes a capacitor for storing charge and a pass transistor (also called a pass gate or access transistor) for transferring charge to and from the capacitor. Data (i.e. 1 bit) stored in the cell is determined by the absence or presence of charge on the storage capacitor. The pass transistor and the trench capacitor are electrically connected through a strap—a portion of conductive material in the trench. During the fabrication of these and other devices, deep trenches are formed in a semiconductor substrate and then filled with a material such as, for example, polysilicon (poly). The material filling the trenches is subsequently recessed to a given depth below a major surface of the substrate.

In order to form an electrical connection between the transistor and the capacitor in a DRAM device, a uniform recess of the poly is necessary. However, it has proven particularly challenging to uniformly recess the poly to a predetermined depth with great precision within millions or even billions of trenches across a semiconductor wafer. The challenge is partially due to variation in the thickness of the deposited poly across the wafer, partially due to the variation in the trench size, and partially due to the variation in recessing process.

In light of the aforementioned difficulties of the processes used to recess materials within trenches, it would be desirable to provide a novel structure and methods of forming a precise and uniform recess depth of a trench poly for forming a trench memory device.

SUMMARY OF THE INVENTION

The present disclosure is directed to a structure and methods of forming a trench memory having a self-aligned strap formed by self-limiting recess. In one embodiment, an interconnect structure is described. The structure includes a trench opening formed in a semiconductor substrate, the semiconductor substrate having a semiconductor-on-insulator (SOI) layer, a buried insulating layer (BOX) layer and a base substrate layer; and a filling material formed in the trench opening, the filling material forming a "V" shape within the trench memory cell, wherein the "V" shape includes a top portion substantially adjacent to a top surface of the BOX layer. In one particular embodiment, the top portion of the "V" shape forms into a poly spacer for electrically connecting to an array transistor. The structure further includes a buried strap formed over the filling material, wherein the poly spacer connects to the array transistor via the buried strap. In one embodiment, the trench opening includes an upper trench portion formed on the SOI layer and a lower trench portion formed on the BOX layer, wherein the lower trench portion is substantially greater than the upper trench portion. The structure further includes a dielectric material deposited in the trench opening, wherein the dielectric material substantially covers sidewall portions and a bottom portion of the trench opening. A portion of the filling material forms at least one spacer on a sidewall of the BOX layer. In one particular embodiment, the filling material is a polysilicon material.

In another embodiment, a semiconductor device is described. The structure includes a trench capacitor formed in a trench opening of a semiconductor substrate, the semiconductor substrate having an SOI layer, a BOX layer and a substrate layer; a transistor formed over the SOI layer; a first conductive filling material formed in a portion of the trench opening, the filling material having a "V" shape within the trench opening, wherein the "V" shape includes a top portion substantially adjacent to a top surface of the BOX layer; and a second conductive filling material formed over the first conductive filling material, the second conductive filling material electrically connecting a source/drain region of the transistor to a portion of the first conductive filling material. The first conductive filling material forms an electrode in the trench capacitor. The semiconductor device further includes a node dielectric formed over a portion of the trench opening, wherein a top portion of the node dielectric substantially reaches a top surface of the BOX layer. The trench opening includes an upper portion formed in the SOI layer and a bottom portion formed on the BOX layer, wherein the bottom portion is substantially greater than the upper portion. In one particular embodiment, the second conductive filling material forms into a self-aligned strap. In addition, the first conductive filling material and the second conductive filling material are polysilicon. The interface between the first filling material and the second filling material includes a "V" shape. In addition, the top portion of the "V" shape includes polysilicon spacer.

A method of forming a semiconductor structure is also described. The method includes forming a trench opening in a semiconductor substrate having an SOI layer, a BOX layer and substrate layer; laterally etching the BOX layer such that a portion of the trench opening associated with the BOX layer is substantially greater than a portion of the trench opening associated with the SOI layer; filling the trench opening with a filling material; and recessing the filling material such that a top portion of the filling material is substantially at the same depth as a top surface of the BOX layer. The recessing includes recessing the filling material to a depth substantially below a major surface of the semiconductor substrate. In addition, the recessing of the filling material forms a void within the filling material. Moreover, the recessing of the filling material is a self-limiting process. In one particular embodiment, the self-limiting process includes forming a poly spacer along a sidewall portion of the BOX layer. In addition, the filling material is a polysilicon.

In a second embodiment of a method of forming a semiconductor structure, the method includes forming a trench opening in a semiconductor substrate, the semiconductor substrate having an SOI layer, a BOX layer and a substrate layer; and forming a filling material in the trench opening, the filling material having a "V" shape within the trench opening, wherein the "V" shape includes a top portion substantially adjacent to a top surface of the BOX layer. The forming of the filling material is a self-limiting process, wherein the filling material forms a poly spacer on a sidewall of the BOX layer.

In yet another embodiment, a method of forming a semiconductor device includes forming a trench capacitor in a trench opening of a semiconductor substrate, the semiconductor substrate having an SOI layer, a BOX layer and a substrate layer; forming a transistor over the SOI layer; forming a first conductive filling material in the trench opening, the filling material forming a "V" shape within the trench memory cell, wherein the "V" shape includes a top portion substantially reaching a top surface of the BOX layer; and forming a second conductive filling material over the first conductive filling material, the second conductive filling material electrically connecting a source/drain region of the transistor to a portion of the first conductive filling material. In this embodiment, the first conductive filling material is a self-limiting process, wherein the filling material forms a poly spacer on a sidewall of the BOX layer.

Other features of the presently disclosed structure and method of forming a trench memory having self-aligned strap formed by self-limiting recess will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming a trench memory having self-aligned strap formed by self-limiting recess will be described hereinbelow with references to the figures, wherein:

FIGS. 1-8 illustrate simplified cross-sectional views of progressive stages of a method of forming a trench memory with self-aligned strap formed by self-limiting recess, in accordance with one embodiment of the present disclosure;

FIG. 9 illustrates exemplary RIE condition for recessing a polysilicon material for forming a poly spacer on a sidewall of a BOX layer, in accordance with one embodiment of the present disclosure.

DETAILED DESCRIPTION

Figure 5:
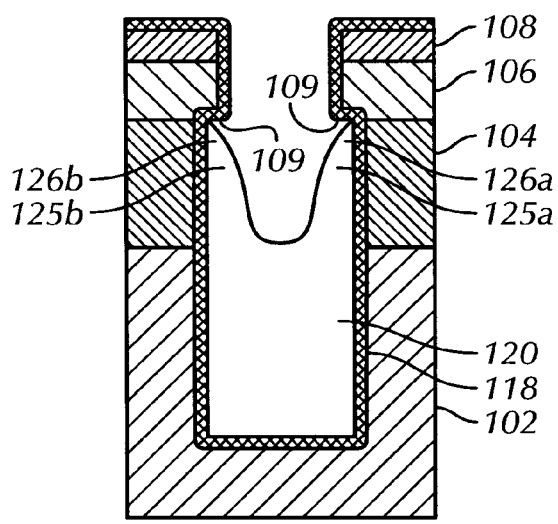

Referring now to the drawing figures, wherein like references numerals identify identical or corresponding elements, an embodiment of the presently disclosed method of forming a trench memory having self-aligned strap formed by self-limiting recess, will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the disclosure. Thus, the materials described herein are employed to illustrate the disclosure in one application and should not be construed as limiting.

FIGS. 1-8 illustrate a structure and method of forming a trench memory with self-aligned strap formed by self-limiting recess. In particular, the structure includes a trench opening formed in a semiconductor substrate, the semiconductor substrate having a semiconductor-on-insulator (SOI) layer, a buried insulating (BOX) layer and a substrate layer; and a filling material filling the trench opening for forming a buried strap, the buried strap having a "V" shape within the trench memory cell, where the "V" shape includes a top portion substantially adjacent to a top surface of the BOX layer. In one particular embodiment, the strap is formed by a self-limiting process, where the filling material forms a spacer on a sidewall of the BOX layer. FIGS. 1-8 further illustrate a method of forming the trench memory with self-align strap formed by self-limiting recess. The method includes forming a trench opening in a semiconductor substrate having an SOI layer, a BOX layer and substrate layer; laterally etching the BOX layer such that a portion of the trench opening associated with the BOX layer is substantially greater than a portion of the trench opening associated with the SOI layer; filling the trench opening with a filling material for forming a strap; and recessing the filling material such that the recessing results in a top portion of the filling material being substantially at the same depth of a top surface of the BOX layer. In one embodiment, the recessing step is a self-limiting process, that is, once the filling material is recessed to a surface adjacent to a top surface of the BOX layer, a spacer is formed on a side wall of the BOX layer and further recessing will not change the top corner of the filling material.

With initial reference to FIG. 1, an embodiment of a semiconductor-on-insulator (SOI) wafer, in accordance with the present disclosure, is illustrated and is designated generally as SOI wafer 100. SOI wafer 100 includes a handle substrate or base semiconductor substrate 102; a buried insulator (e.g. buried oxide (BOX)) layer 104 formed on base semiconductor substrate 102; and an SOI layer 106 formed on BOX layer 104, where BOX layer 104 isolates SOI layer 106 from base semiconductor substrate 102. A pad layer 108 is formed on a top surface of SOI layer 106.

Base semiconductor substrate 102 may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, base semiconductor substrate 102 may be about, but is not limited to, several hundred microns thick. For example, base semiconductor substrate 102 may include a thickness ranging from about 0.5 mm to about 1.5 mm.

Buried insulator (BOX) layer 104 may include, for example, silicon oxide. BOX 104 may also be formed from any of several dielectric materials. Non-limiting examples include, for example, oxides, nitrides and oxynitrides of silicon. Other dielectric materials such as high-k dielectric materials which have a dielectric constant greater than 7 are also envisioned. In addition, BOX layer 104 may include crystalline and/or non-crystalline dielectric material. Furthermore, BOX layer 104 may include a single or multiple layers. BOX layer 104 may be formed using any of several methods. Non-limiting examples include ion implantation methods, thermal or plasma oxidation or nitridation methods, chemical vapor deposition methods and physical vapor deposition methods. Typically, BOX layer 104 includes an oxide of the semiconductor from which base semiconductor substrate 102 is comprised. In one embodiment, BOX layer 104 includes a thickness of about 300 nm. Alternatively, BOX layer 104 may include a thickness ranging from about 10 nm to about 500 nm.

SOI layer 106 may include any of the several semiconductor materials included in base semiconductor substrate 102. In general, base semiconductor substrate 102 and SOI layer 106 may include either identical or different semiconductor materials with respect to chemical composition, dopant concentration and crystallographic orientation. In one particular embodiment of the present disclosure, base semiconductor substrate 102 and SOI layer 106 include semiconductor materials that include at least different crystallographic orientations. Typically one of base semiconductor substrate 102 and SOI layer 106 includes a {110} crystallographic orientation and the other of base semiconductor substrate 102 and SOI layer 106 includes a {100} crystallographic orientation. Typically, SOI layer 106 includes a thickness ranging from about 5 nm to about 100 nm.

Pad layer 108 includes an insulating material such as, for example, silicon nitride. Pad layer 108 may be formed using conventional lithographic patterning methods, for example, low-pressure chemical vapor deposition (LPCVD) and depositing SiN of a thickness ranging from about 10 nm to about 500 nm. In one particular embodiment, pad nitride layer 108 includes a thickness of about 100 nm. Optionally, a thin (2 nm to 10 nm, preferably 5 nm) thermal oxide layer (not shown) may be formed on SOI layer 106 prior to forming pad nitride layer 108.

With continued reference to FIG. 1, hardmask layer 110 having a suitable masking material is deposited on pad layer 108 and patterned using a conventional photolithography technique. In one embodiment, hardmask layer 110 includes a dielectric material. In another embodiment, hardmask layer 110 includes silicon oxide, silicon oxynitride, carbide, silicon nitride, carbon, or a combination thereof. In yet another embodiment, the hardmask layer 110 includes suitable masking materials such as, for example, photoresist or hardmask such as oxide. A method of depositing hardmask layer 110 may be deposited using relatively low temperature techniques, such as deposition from TEOS (tetraethylorthosilicate) precursor or a silane precursor.

With reference to FIG. 2, a deep trench 112 is defined and formed in the wafer 100 using patterning and etching process well known in the art. In particular, deep trench 112 is formed by etching through pad layer 108, SOI layer 106, BOX layer 104, and stopping at base semiconductor layer 102, as illustrated by the figure. Deep trench 112 is formed using, for example, an anisotropic dry etch technique, such as reactive ion etch (RIE). The mask layer may be removed after trench 112 is defined and formed, or, alternatively, in a later process. In one particular embodiment, a lower portion of trench 112 may be widened for form a bottle-shaped trench, having upper trench opening 113a and lower trench opening 113b, where the lower trench opening 113b in base semiconductor layer 102 is substantially wider than the upper trench opening 113a in SOT layer 106. Methods for forming bottle-shaped trenches are well known in the art. For example, a protection layer (not shown) may be formed in the upper trench sidewall while a lower trench is widened by etching the silicon in the substrate. Furthermore, a buried plate 114 (e.g. a heavily doped region in the substrate surrounding the lower trench opening 113b of trench 112) may be formed by any known method, such as ion implantation, plasma doping, gas phase doping, etc. For simplicity, buried plate 114 will be omitted in subsequent figures.

With reference to FIG. 3, BOX layer 104 is laterally etched extending lower trench opening 113b, thus creating an overhanging 116 feature in a portion in SOI layer 106. Known processes for laterally etching BOX layer 104 include, but are not limited to, a wet etch process such as an etchant containing hydrofluoric acid, a dry etch such as chemical oxide removal or plasma etch.

With reference to FIG. 4, a node dielectric 118 is deposited over the structure shown in FIG. 3, thus covering sidewalls and bottom portions of trench 112 and the top surface of pad nitride 108. Node dielectric 118 may include any suitable dielectric material including, but not limited to, silicon nitride, silicon oxide, silicon oxynitride, high-k (high dielectric) material, or any suitable combination of these materials.

Node dielectric 118 can be formed by any suitable processes including, but not limited to, thermal oxidation, thermal nitridation, chemical vapor deposition (CVD), and/or atomic layer deposition (ALD).

With continued reference to FIG. 4, a first filling material 120 is deposited over the structure, filling trench 112. In one embodiment, filling material 120 comprises a conducting material including, but not limited to, amorphous silicon, polycrystalline silicon (polysilicon), amorphous or polycrystalline germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), carbon, or any suitable combination of these materials. First filling material 120 is deposited by any suitable method, including but not limited to, ALD, low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), physical vapor deposition, sputtering, plating, evaporation, ion beam deposition, electron beam deposition, and laser assisted deposition.

In one particular embodiment, first filling material 120 is a doped polysilicon (poly) deposited by LPCVD. Since the upper trench opening 113a in SOI layer 106 is narrower than lower trench opening 113b in BOX layer 104, void 122 may form in the first filling material 120 in BOX layer 106.

With reference to FIG. 5, a dry etch process is performed to recess filling material 120. In one embodiment, the dry etch is a reactive ion etch (RIE) which vertically recesses filling material 120 in trench 112 with minimal lateral etch. As illustrated by the figure, and because upper trench opening 113a in SOI layer 106 is narrower than lower trench opening 113b in BOX layer 104, an aggressive over-etch can be performed to ensure a complete removal of filling material 120 to a height adjacent the top surface of the BOX layer 104 across the entire wafer 100. Moreover, the dry etch process of filling material 120 forms into a "V" shape within trench opening 112. As illustrated by the figure, the "V" shape of filling material 120 includes top portions 125a, 125b substantially adjacent to the top surface of BOX layer 104.

With continued reference to FIG. 5, top portions 125a and 125b of filling material 120 includes poly spacers 126a and 126b, respectively formed on a trench sidewall of BOX layer 104. It is noted that due to the shadowing effect of SOI layer 106, the top portion of poly spacers 126a and 126b stop at a bottom portion 109 of SOI layer 106, virtually independent of RIE over-etch. In one particular embodiment, void 122 (FIG. 4) following the deposition of filling material 120 further facilities the formation of poly spacers 126a and 126b. Void 122 in FIG. 4 is preferred but not required for forming poly spacers 126a and 126b.

Figure 6:
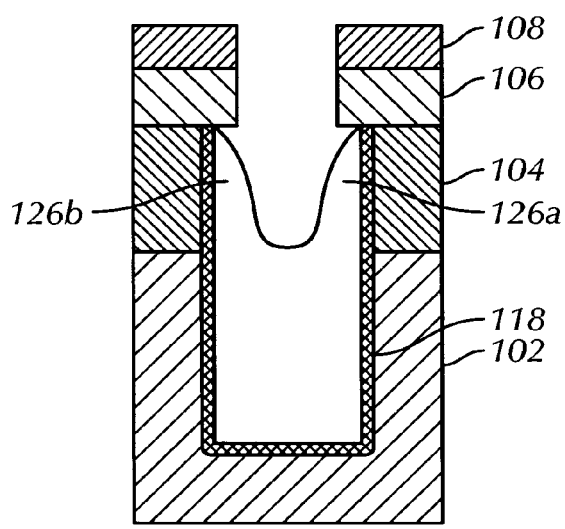

FIG. 6 illustrate the structure in FIG. 5 with any exposed node dielectric 118 having being removed using any conventional method known in the art. For example, nitride can be etched by a wet etching solution with an etchant containing hydrofluoric/ethylene glycol (HF/EG) or phosphoric acid.

Figure 7:
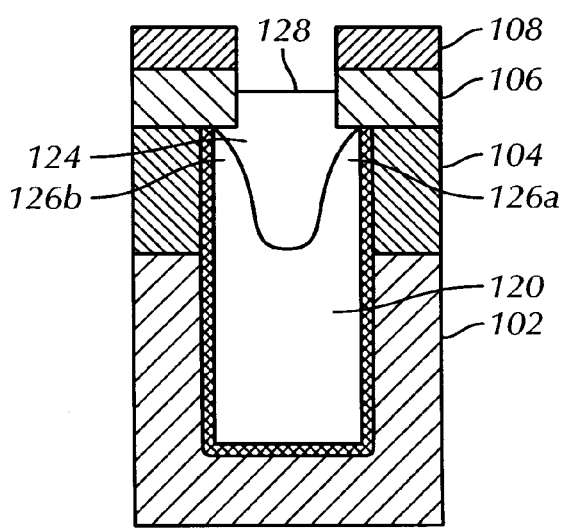

With reference to FIG. 7, a second filling material 128 is deposited over first filling material 120 and recessed to a predetermined depth, for forming a strap 124 (a portion of the second filling material 128). The sidewalls and bottom of SOI layer 106 are covered by the second filling material 128, such that strap 124 is self-aligned to SOI layer 106. Materials and deposition methods described above for forming first filling material 120 can be used for forming the second filling material 128. First filling material 120 and second filling material 126 may comprise the same or different materials formed by same or different deposition methods. In one embodiment, both first and second filling materials 120, 128 comprise polysilicon. Optionally, a thin interface layer (not shown) can be formed on the exposed trench sidewall of SOI layer 106 prior to the deposition of second filling material 128 to prevent defect formation in subsequent processes. The interface layer, when present, may have a thickness thin enough to allow carriers (electrons and holes) to tunneling through it. More specifically, the interface layer may comprises a thin silicon nitride, silicon carbide, or silicon oxide formed by thermal oxidation, thermal nitridation, chemical oxidation, chemical nitridation, CVD, or ALD process. In one particular embodiment, the interface layer includes silicon nitride and has a thickness ranging from about 5 to 10 angstroms.

Figures 8, 9:
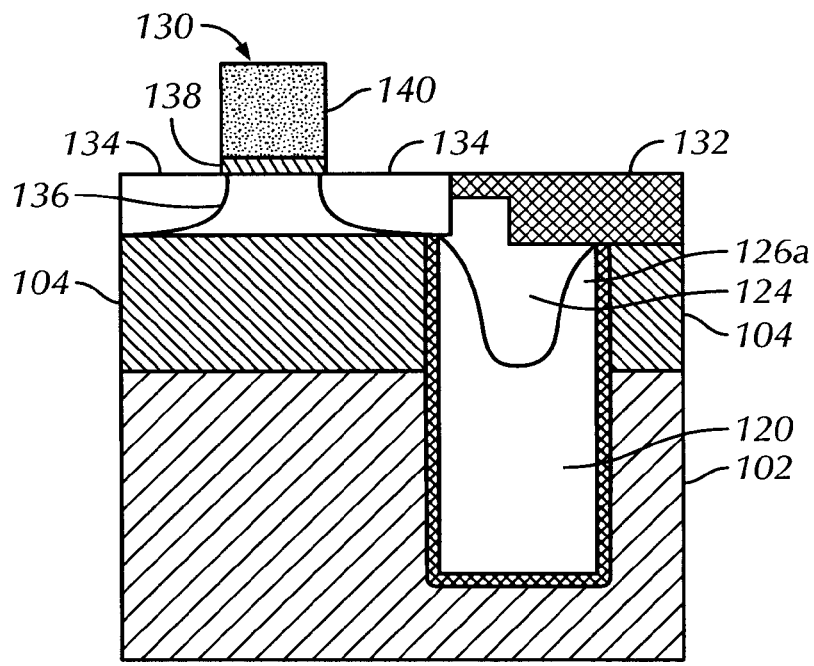

With reference to FIG. 8, the formation of a trench DRAM memory device is completed by forming shallow trench isolation (STI) 132, removing pad layer 108, and forming an array transistor 130, using methods well known in the art. In one embodiment, STI 132 is formed by patterning and etching shallow trench 112, filling the shallow trench with an insulating material (e.g., oxide), and planarizing the insulating materials (e.g., by chemical mechanical planarization). Pad layer 108 may be removed after forming of STI 132. Array transistor 130 includes two source/drain regions 134 separated by a channel region 136 formed in SOI layer 106. A gate dielectric 138 and a gate electrode 140 are formed above channel region 136. Gate dielectric 138 may include silicon oxide, silicon oxynitride, silicon nitride, high-k dielectric, or combination of those materials. Gate electrode 140 may include silicon, germanium, silicon germanium, metal (e.g., tungsten), metallic compound (e.g., titanium nitride, nickel silicide), or combination of those materials. One terminal of the source/drain regions 134 of transistor 130 is electrically connected to the trench poly (i.e. first filling material 120) through buried strap 124 (i.e. second filling material 128).

FIG. 9 illustrates a Table 1 illustrating an exemplary RIE condition for recessing the first filling material, e.g. poly, to form the poly spacer on the sidewall of BOX layer 104.

Figure 10:
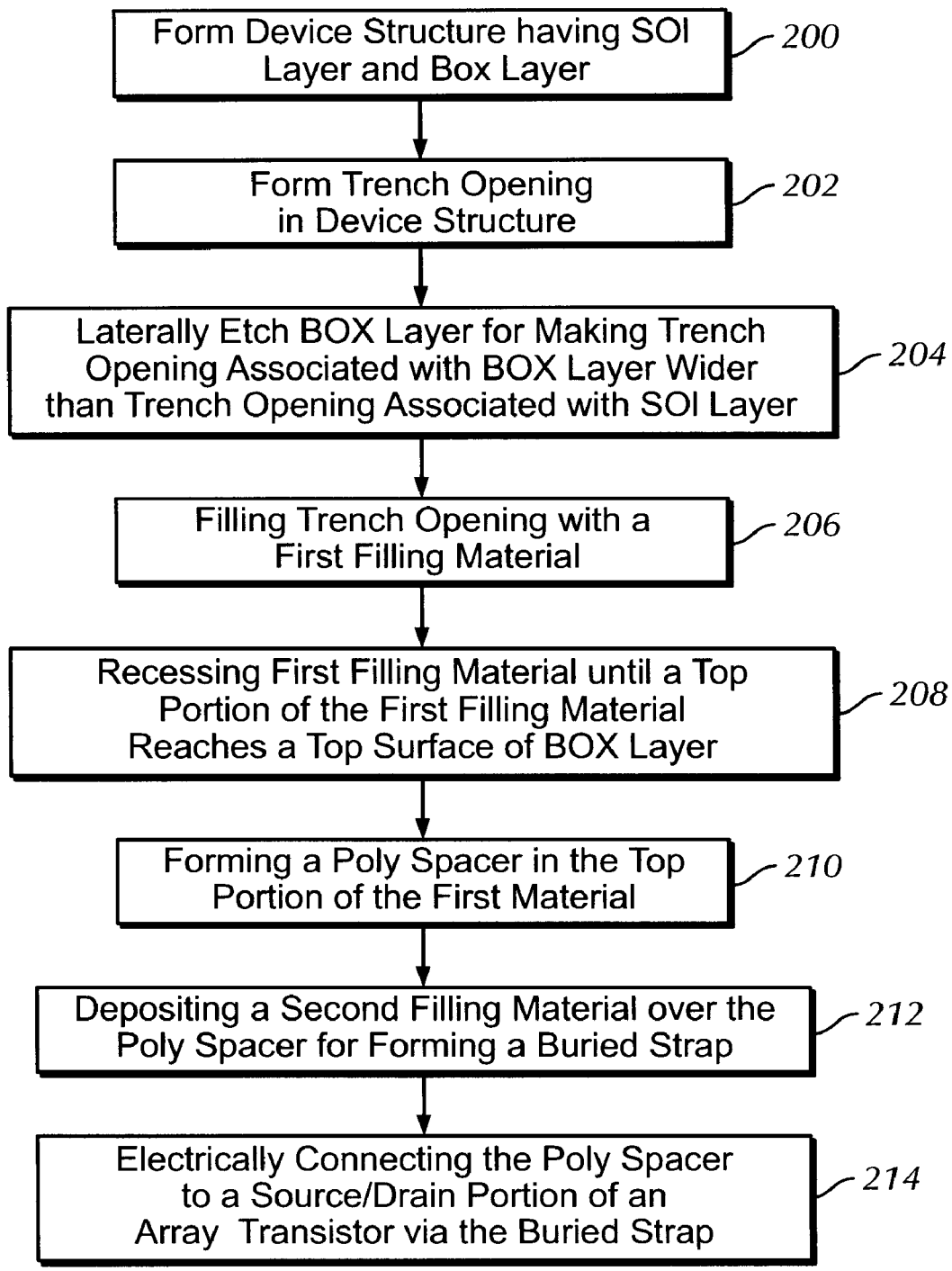
FIG. 10 is an exemplary flow diagram illustrating a method of forming a trench memory with self-aligned strap formed by self-limiting recess, in accordance with one embodiment of the present disclosure.

With reference to FIG. 10, in conjunction with FIGS. 1-9, a flow diagram of an exemplary method of forming a trench memory with self-aligned strap formed by self-limiting recess, in accordance with the present disclosure, is illustrated. Initially, at step 200, a device structure, such as, for example an SOI wafer 100 is formed having a silicon base layer 102, a BOX layer 104 and an SOI layer 106, as discussed hereinabove. In accordance with the present disclosure, at step 202, a trench location pattern is formed using a typical photolithographic process and trench 112 is partially etched into the device structure. At step 204, BOX layer 104 is laterally etched for making the trench opening associated with BOX layer 104 wider than the trench opening associated with SOI layer 106, i.e. forming trench 112 into a bottle-shape. At step 206, trench opening 112 is filled with filling material 120. At step 208, filling material 120 is recessed until it is adjacent to the top surface of BOX layer 104. Recessing filling material 120 forms poly spacers 126a and 126b in a top portion of filling material 120, at step 210. At step 212, a second filling material 128 is deposited over the poly spacers 126a and 126b for forming a strap 124. Finally, at step 214, poly spacers 126a and 126b are electrically connected to a source/drain portion 134 of an array transistor 130 via strap 124.

It will be understood that numerous modifications and changes in form and detail may be made to the embodiments of the presently disclosed structure and method of forming a self-liming recess in a trench memory having a self-aligned strap. It is contemplated that numerous other configuration of the interconnect structure may be formed, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of forming a semiconductor structure, the method comprising:

forming a trench opening in a semiconductor substrate having a semiconductor-on-insulator (SOI) layer, a buried insulating (BOX) layer and substrate layer;

laterally etching said BOX layer such that a portion of said trench opening associated with said BOX layer is substantially greater than a portion of said trench opening associated with said SOI layer;

filling said trench opening with a filling material; and recessing said filling material such that a top portion of said filling material is substantially at the same depth as a top surface of said BOX layer, wherein said recessing includes recessing said filling material to a depth substantially below a major surface of said semiconductor substrate, wherein said recessing of said filling material forms a void within said filling material.

2. The method recited in claim 1, wherein said recessing of said filling material is a self-limiting process.

3. The method recited in claim 2, wherein said self-limiting process includes forming a spacer along a sidewall portion of said BOX layer.

4. The method recited in claim 1, wherein said filling material is a polysilicon.

5. A method of forming a semiconductor structure, the method comprising forming a trench opening in a semiconductor substrate, said semiconductor substrate having a semiconductor-on-insulator (SOI) layer, a buried insulating (BOX) layer and a substrate layer; and forming a filling material in said trench opening, said filling material having a "V" shape within said trench opening, wherein said "V" shape includes a top portion substantially adjacent to a top surface of said BOX layer.

6. The method recited in claim 5 wherein said forming a filling material is a self-limiting process, wherein said filling material forms a poly spacer on a sidewall of said BOX layer.

7. A method of forming a semiconductor device, the method comprising:

forming a trench capacitor in a trench opening of a semiconductor substrate, said semiconductor substrate having a semiconductor-on-insulator (SOI) layer, a buried insulating (BOX) layer and a substrate layer;

forming a transistor over said SOI layer;

forming a first conductive filling material in said trench opening, said filling material forming a "V" shape within said trench opening, wherein said "V" shape includes a top portion substantially reaching a top surface of said BOX layer; and forming a second conductive filling material over said first conductive filling material, said second conductive filling material electrically connecting a source/drain region of said transistor to a portion of said first conductive filling material.

8. The method recited in claim 7, wherein said first conductive filling material is a self-limiting process, wherein said first conductive filling material forms a poly spacer on a sidewall of said BOX layer.

* * * * *